United States Patent
Sakong (10) Patent No.: US 9,730,343 B2
(45) Date of Patent: Aug. 8, 2017

(54) DISPLAY DEVICE

(71) Applicant: LG ELECTRONICS INC., Seoul (KR)

(72) Inventor: Jungyul Sakong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 149 days.

(21) Appl. No.: 14/591,791

(22) Filed: Jan. 7, 2015

(65) Prior Publication Data

US 2015/0208529 A1    Jul. 23, 2015

(30) Foreign Application Priority Data

Jan. 20, 2014  (KR) .......................... 10-2014-0006505

(51) Int. Cl.
  *H05K 5/00*    (2006.01)
  *H05K 5/02*    (2006.01)
  *G02F 1/1333*  (2006.01)
  *G06F 1/16*    (2006.01)

(52) U.S. Cl.
  CPC ..... *H05K 5/0217* (2013.01); *G02F 1/133308* (2013.01); *G06F 1/1601* (2013.01); *H05K 5/0017* (2013.01); *G02F 2001/133314* (2013.01); *G02F 2201/46* (2013.01); *G02F 2201/465* (2013.01); *G06F 2200/1612* (2013.01)

(58) Field of Classification Search
  CPC ............... G02F 1/133308; G02F 2001/133314
  See application file for complete search history.

(56) References Cited

U.S. PATENT DOCUMENTS

| 7,940,287 | B2* | 5/2011 | Kim ................. G02F 1/133308 345/102 |
| 2003/0223215 | A1 | 12/2003 | Shin et al. |
| 2009/0009680 | A1* | 1/2009 | Zensai ............. G02F 1/133308 349/58 |
| 2011/0261282 | A1 | 10/2011 | Jean et al. |
| 2014/0002969 | A1* | 1/2014 | Hwang ............... H05K 5/0017 361/679.01 |
| 2015/0277179 | A1* | 10/2015 | Nishi .................. G02B 6/0088 349/58 |

FOREIGN PATENT DOCUMENTS

| EP | 1 892 560 A2 | 2/2008 |
| EP | 2 447 762 A2 | 5/2012 |

OTHER PUBLICATIONS

European Search Report issued in Application No. 15000130.3 dated Jun. 1, 2015.

* cited by examiner

*Primary Examiner* — Kristina Junge
(74) *Attorney, Agent, or Firm* — Ked & Associates, LLP

(57) ABSTRACT

A display device is disclosed. The display device may include a display panel and cover. A first cover may be configured to be connected to the display panel and a second cover may be connected to the first cover to cover the display panel. The first cover and the second cover may cover a back side of the display panel. A plurality of first holders may be disposed on the first cover and a plurality of second holders may be disposed on the second cover corresponding to the plurality of first holders to couple the second cover to the first cover. The first cover may include a first frame and a second frame connected to each other. Distal ends of the first and second frames may have prescribed shapes configured to couple to each other to form a low profile cover for the display device.

11 Claims, 15 Drawing Sheets

DISPLAY DEVICE

CROSS-REFERENCE TO RELATED APPLICATION(S)

This application claims priority under 35 U.S.C. §119 to Korean Application No. 10-2014-0006505 filed on Jan. 20, 2014, whose entire disclosure is hereby incorporated by reference.

BACKGROUND

1. Field

The present disclosure relates to a display device, and more particularly, to a display device which allows a plurality of covers to be securely connected together by surface contact.

2. Background

As the functions of display devices, such as personal computers, laptops, mobile phones, TVs, etc., have become diversified, display devices are implemented in the form of a multimedia player having comprehensive functions such as capturing still and video images, playing music or video files, playing games, receiving broadcasts, and the like.

Display devices may be divided into mobile terminals and stationary terminals according to mobility. Mobile terminals may be divided into handheld terminals and vehicle mount terminals according to whether or not a user can carry it with them.

In order to support and increase the functionality of display devices, the improvement of structural parts and/or software parts of the display devices can be taken into account.

BRIEF DESCRIPTION OF THE DRAWINGS

The embodiments will be described in detail with reference to the following drawings in which like reference numerals refer to like elements wherein.

DETAILED DESCRIPTION

The above objects, characteristic, and merits of the present disclosure will become more apparent from the following detailed description taken in conjunction with the accompanying drawings. The present disclosure may be modified in various ways and may have some embodiments. Hereinafter, some exemplary embodiments of the present disclosure will be illustrated in the accompanying drawings and described in detail. Wherever possible, the same reference numbers will be used throughout the drawings to refer to the same or like parts. Furthermore, a detailed description of the known functions or elements pertinent to the present disclosure will be omitted if it is deemed to make the gist of this document unnecessarily vague. Ordinal numbers (for example, first and second) used in the course of a description of this specification are only identification symbols for distinguishing one element from the other element.

Hereinafter, a display device related to the present disclosure will be described in more detail with reference to the accompanying drawings. The suffixes 'module' and 'unit' for the elements used in the following description are given or used in common by considering facilitation in writing this disclosure only but fail to have meanings or roles discriminated from each other.

The display device to be described in this specification may include a cellular phone, a smartphone, a laptop computer, a digital broadcasting terminal, personal digital assistants (PDA), a portable multimedia player (PMP), a navigation system and/or so on.

Except for a case applicable to a mobile terminal only, it is apparent to those skilled in the art that the configurations according to an embodiment described in this disclosure is applicable to such a stationary terminal as a digital TV, a desktop computer and the like.

Figure 1:
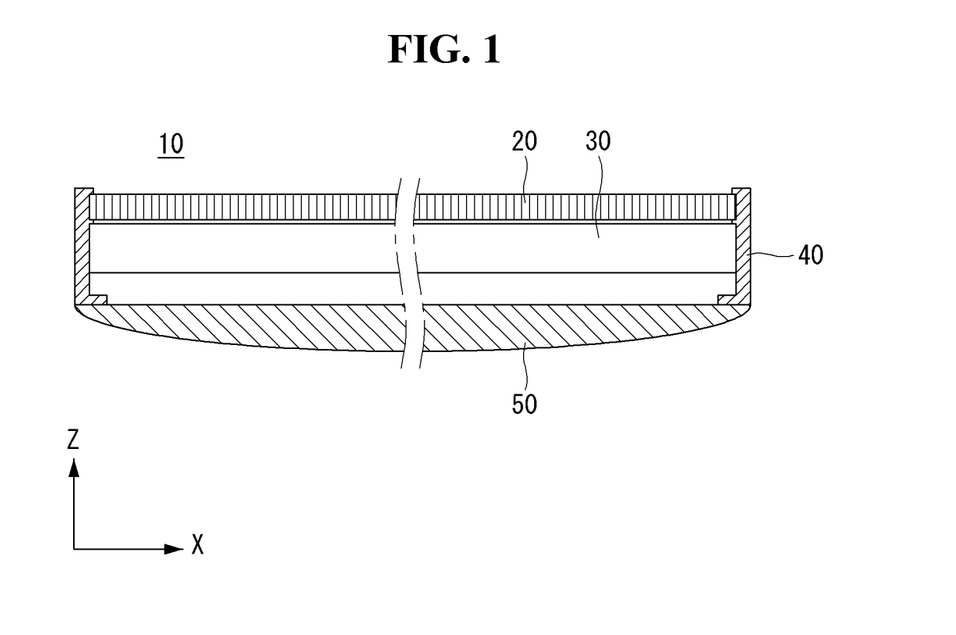
FIG. 1 is a cross-sectional view of a display device according to one exemplary embodiment of the present disclosure.

FIG. 1 is a cross-sectional view of a display device according to one exemplary embodiment of the present disclosure. The display device 10 may include a display panel 20, auxiliary equipment 30, a frame 40, and a back cover 50.

The display panel 20 may comprise a liquid crystal panel. However, the present disclosure is not limited to it and the display panel 20 may be a plasma display panel (PDP), a field emission display (FED), or an organic light emitting display (OLED). Although shown in a simplified form, the display panel 20 may comprise various types of devices, such as an optical layer or a protective board, for displaying images and protecting the inside. The auxiliary equipment 30 may be various types of electronic devices provided to operate the display device 10.

The frame 40 may be a part that is provided outside the display panel 20 and/or the auxiliary equipment 30 and accommodates the display panel 20 and/or the auxiliary equipment 30. The frame 40 may constitute the overall shape of the display device 10. The frame 40 may be made of an Al-containing material. The frame 40 may be molded by press working. The frame 40 may cover the sides of the display device 10, and hence, may also be referred to as a side or bottom cover/cabinet.

The back cover 50 may be a component that shields the rear surface portion of the display device 10. The back cover 50 may be attached to the frame 40. The back cover 50 according to one exemplary embodiment of the present disclosure may be connected to the frame via holders (80 and 90 of FIG. 11) corresponding to the back cover 50 and the frame 40. Using the holders (80 and 90 of FIG. 11) according to one exemplary embodiment of the present disclosure, the back cover 50 can be easily assembled/reassembled and, once assembled, remain securely connected to the frame 40.

Figure 2:
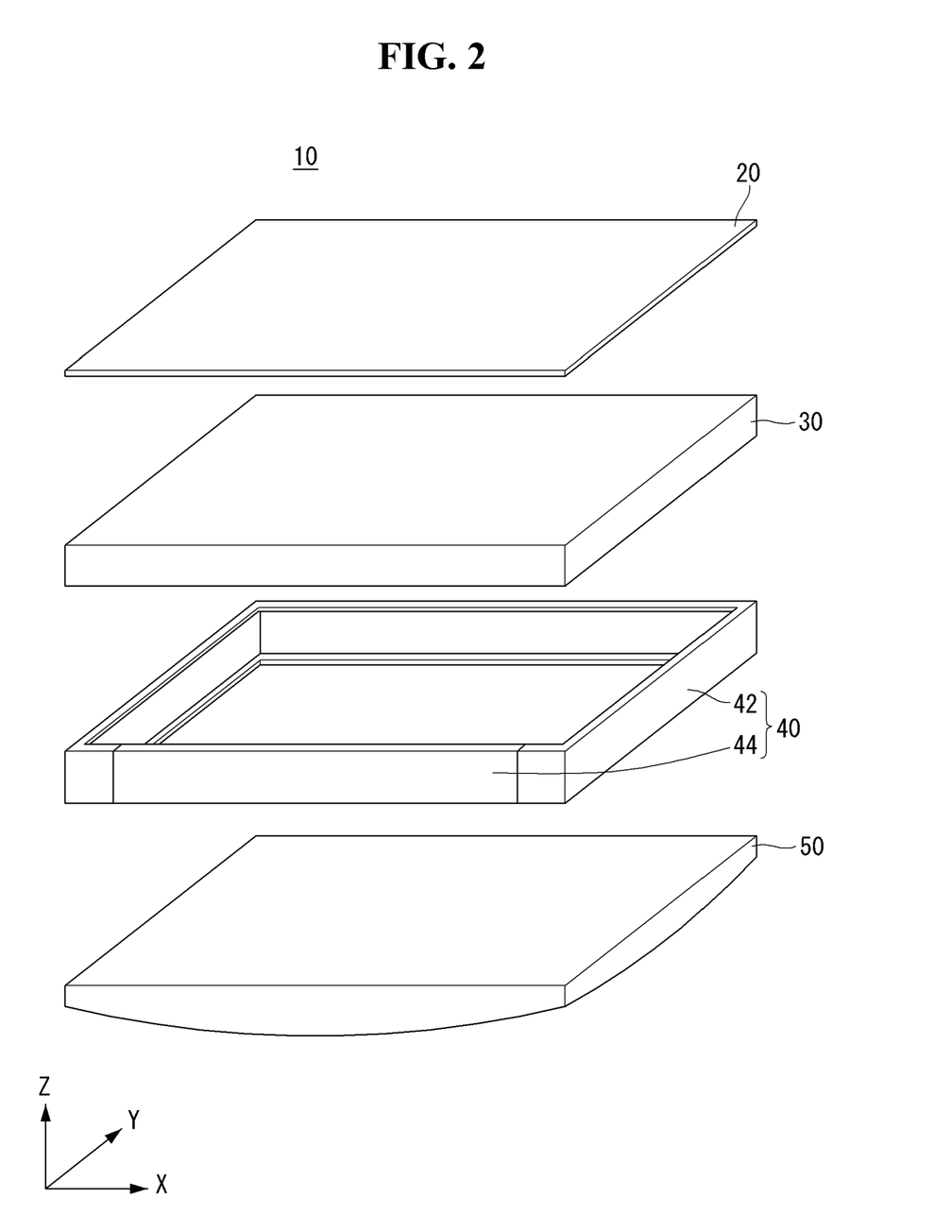
FIG. 2 is an exploded perspective view of the display device of FIG. 1.

FIG. 2 is an exploded perspective view of the display device of FIG. 1. The display device 10 according to one exemplary embodiment of the present disclosure may comprise the frame 40 and the back cover 50.

As described above, the frame 40 may constitute the overall shape of the display device 10. The frame 40 may comprise a first frame 42 and a second frame 44. The first frame 42 may be referred to as a side cover, and the second frame 44 may be referred to as a bottom cover.

The first frame 42 may be molded into a shape corresponding to at least three sides of the rectangular frame 40. For example, the frame 42 may be a part corresponding to the top side and left and right sides of the frame 40, and part of the first frame 42 may extend to the bottom side. The first frame 42 may comprise at least one locking groove (64 of FIG. 4).

The second frame 44 may be molded into a shape corresponding to at least one side of the rectangular frame 40. For example, the frame 42 may be a part corresponding to the bottom side of the frame 40. The second frame 44 may be attached to the first frame 42 and constitute the overall shape of the frame 40.

Figure 3:
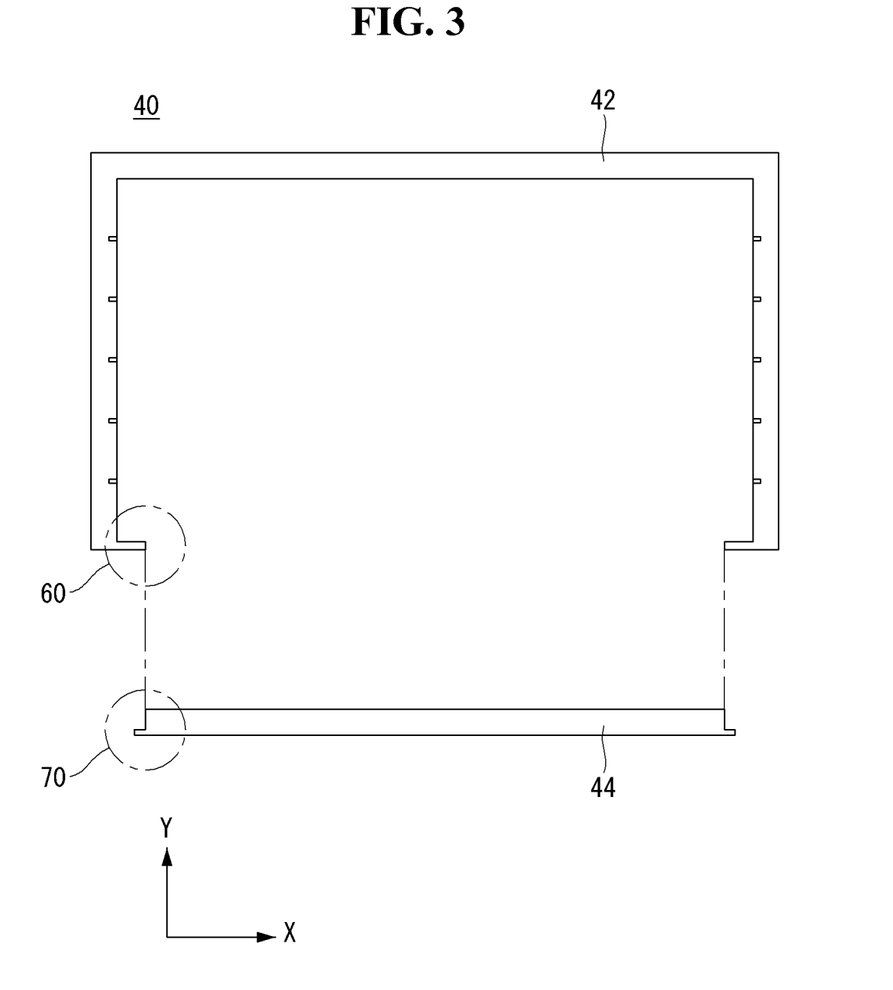
FIG. 3 is a view illustrating the relationship of connection between the first and second frames of the display device of FIG. 1.

FIG. 3 is a view illustrating the relationship of connection between the first and second frames of the display device of FIG. 1. As shown therein, the frame 40 according to one exemplary embodiment of the present disclosure may be formed by connecting together a first connecting portion 60 of the first frame 42 and a second connecting portion 70 of the second frame 44.

The first connecting portion 60 may be located at either end of the first frame 42. This means that the first connecting portion 60 may be configured at either end of the first frame 42 to correspond to the second connecting portion 70 of the second frame 44. There may be partial overlap between the first connecting portion 60 of the first frame 42 and the second connecting portion 70 of the second frame 44.

Figure 4:
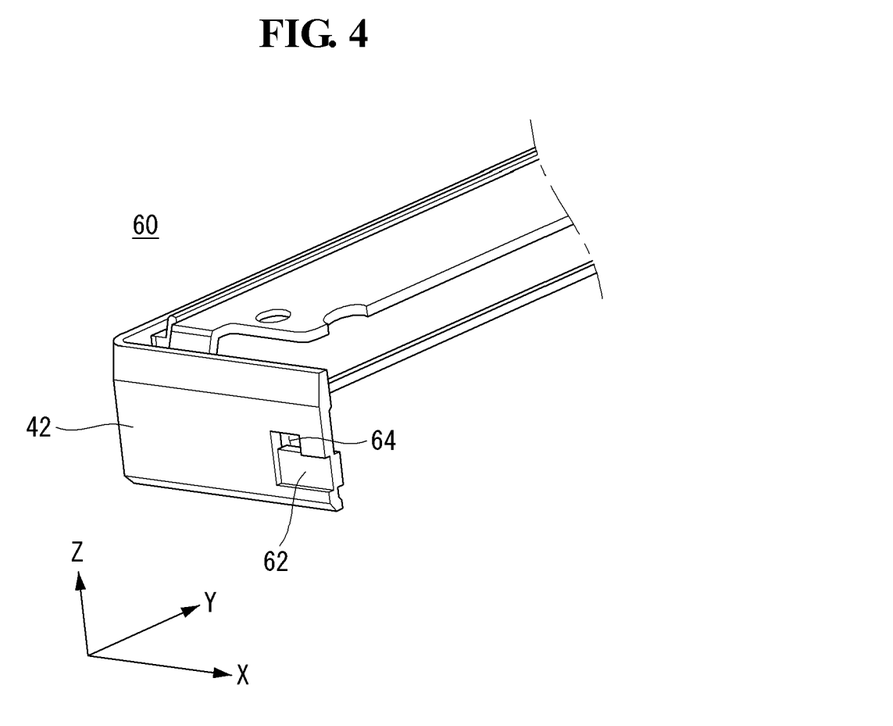
FIG. 4 is a perspective view of the first frame of FIG. 2.
Figure 5:
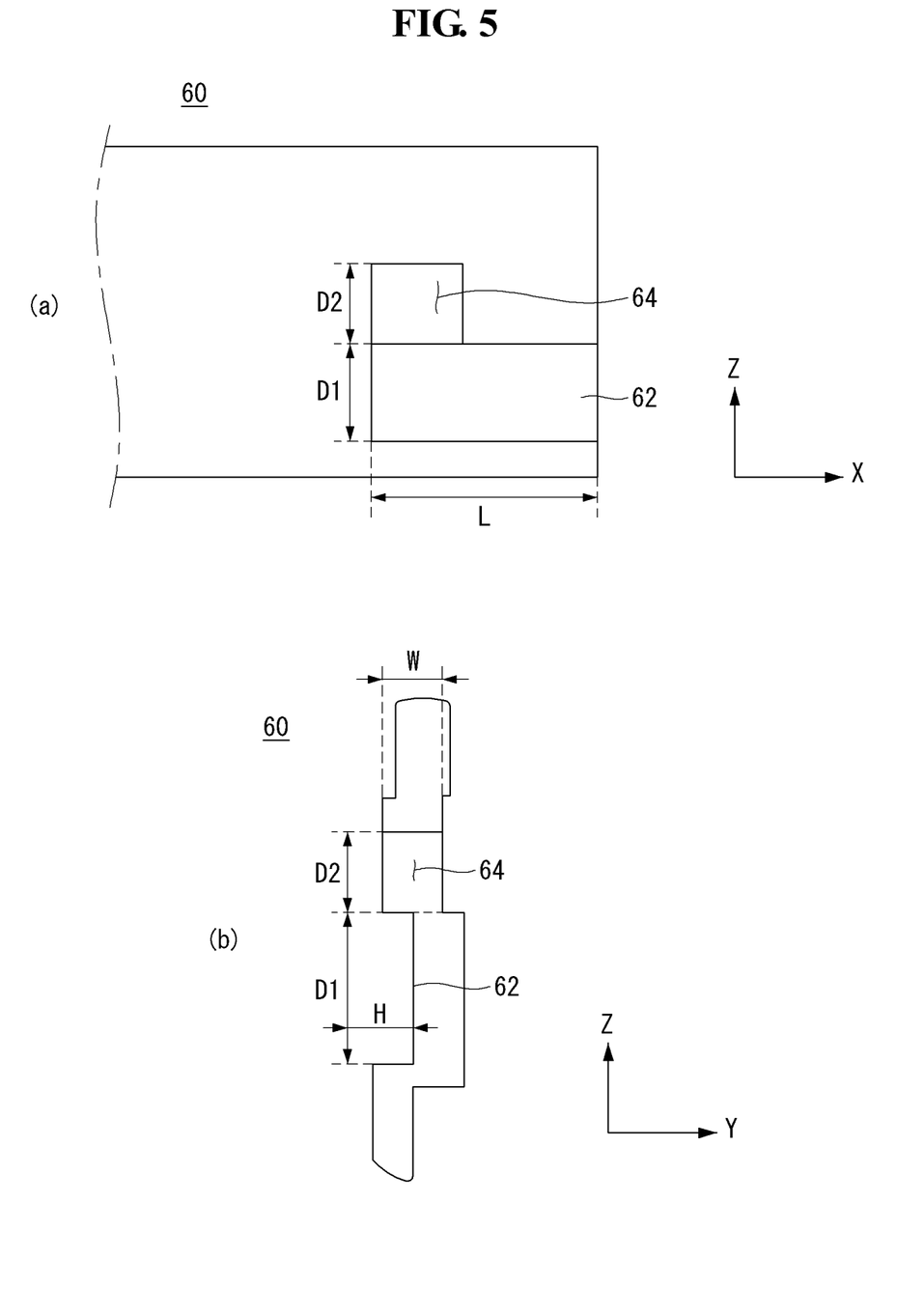
FIG. 5 is front and side views of the first frame of FIG. 4.

FIG. 4 is a perspective view of the first frame of FIG. 2. FIG. 5 is front and side views of the first frame of FIG. 4. As shown therein, the first connecting portion 60 of the first frame 42 according to one exemplary embodiment of the present disclosure may comprise a connecting surface 62 and a locking groove 64.

The connecting surface 62 may be shaped like a rectangular groove (or recess) with length L and depth D1 and provided on the surface of the first connecting portion 60. The length and/or height of the connecting surface 62 may correspond to a locking rib (72 of FIG. 7) of the second connecting portion 70. This means that, once the first and second connecting portions 60 and 70 are connected together, the connecting surface 62 and the locking rib (72 of FIG. 7) are fastened together.

The locking groove 64 may be a through hole formed in the first frame 42. The locking groove 64 may be shaped like a rectangular hole with height D2. The locking groove 64 may have depth W corresponding to the thickness of the first frame 42 at the corresponding position. This means that the locking groove 64 penetrates into the first frame 42. While the locking groove as described above is a hole, the locking groove 64 may also be a groove or recess which has a depth W greater than the height H of the connecting surface 62. The shape of the locking groove 64 may correspond to a locking protrusion (74 of FIG. 7).

Figure 6:
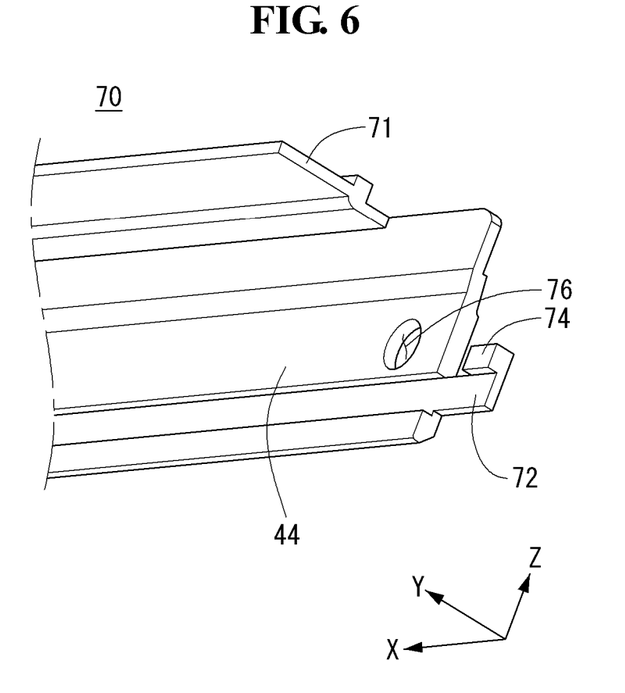
FIG. 6 is a perspective view of the second frame of FIG. 2.
Figure 7:
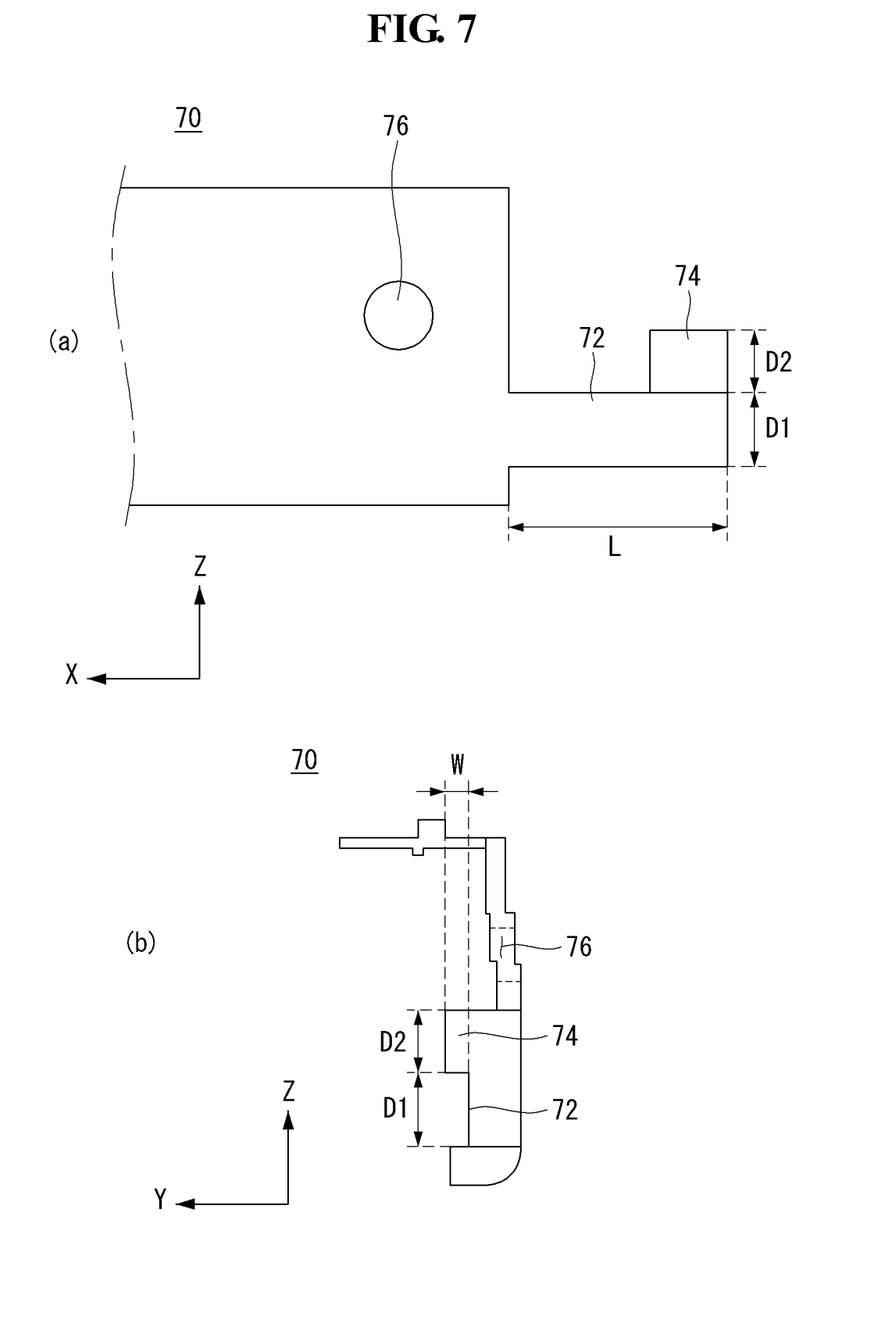
FIG. 7 is front and side views of the second frame of FIG. 4.

FIG. 6 is a perspective view of the second frame of FIG. 3. FIG. 7 is front and side views of the second frame of FIG. 6. As shown therein, the second connecting portion 70 of the second frame 44 according to one exemplary embodiment of the present disclosure may comprise a locking rib 72, a locking protrusion 74, and a fastening hole 76.

The locking rib 72 may be a part extending from the second connecting portion 70. For example, the locking rib 72 may be a part that protrudes from the second connecting portion 70 in the shape of a rectangle with length L and/or height D1.

The locking rib 72 may have a structure corresponding to the connecting surface 62 of the first connecting portion 60. This means that the length and/or height of the locking rib 72 may substantially correspond to the length and/or height of the connecting surface 62.

The locking protrusion 74 may have a structure protruding inward by W2 from the locking rib 72. The locking protrusion 74 may have a structure corresponding to the connecting hole 64 of the first connecting portion 60. This means that the height D2 and/or depth W2 of the locking protrusion 74 may correspond to the height D2 of the locking groove 64 and/or the size of a penetrated region.

The fastening hole 76 may be a through hole formed in the second frame 44. After fastening the first and second frames 42 and 44 first, the first and second frames 42 and 44 and/or the auxiliary equipment 30 may be fastened to each other by connecting a screw (46 of FIG. 8) to the fastening hole 76.

Figure 8:
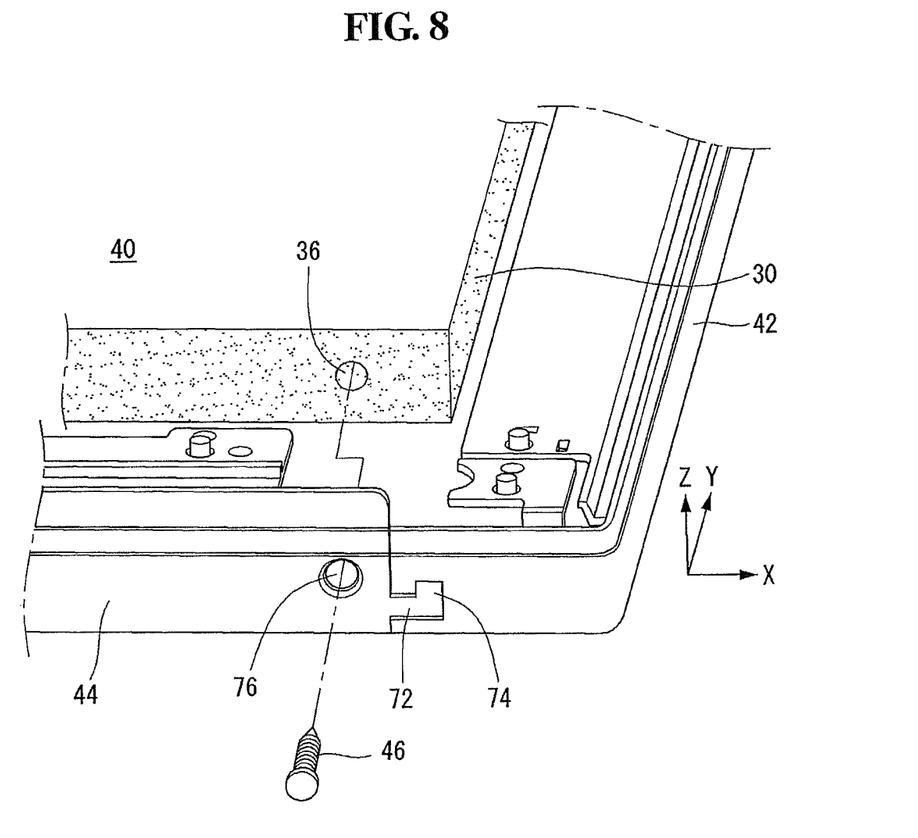
FIG. 8 is a perspective view of the first and second frames of FIG. 3 connected together.

FIG. 8 is a perspective view of the first and second frames of FIG. 3 connected together. As shown therein, the display device 10 according to one exemplary embodiment of the present disclosure may comprise a frame 40 with the first and second frames 42 and 44 connected together.

The first and second frames 42 and 44 may be easily and securely connected via a corresponding hook-like connecting member. This means that the locking rib 72 and locking protrusion 74 of the second frame 44 are connected to the first frame 42.

After connecting the first and second frames 42 and 44 by fastening the locking rib 72 and the locking protrusion 74, the screw 46 may be connected to the fastening hole 76. The screw 46, after passing through the fastening hole 76, may be connected to a fastening groove 36 of the auxiliary equipment 30. Once the screw 46 is connected, the first and second frames 42 and 44 and/or the auxiliary equipment 30 can be securely fixed. Also, the first and second frames 42 and 44 can remain securely connected using only a few screws 46, owing to the unique connection structure of the first and second frames 42 and 44.

Figure 9:
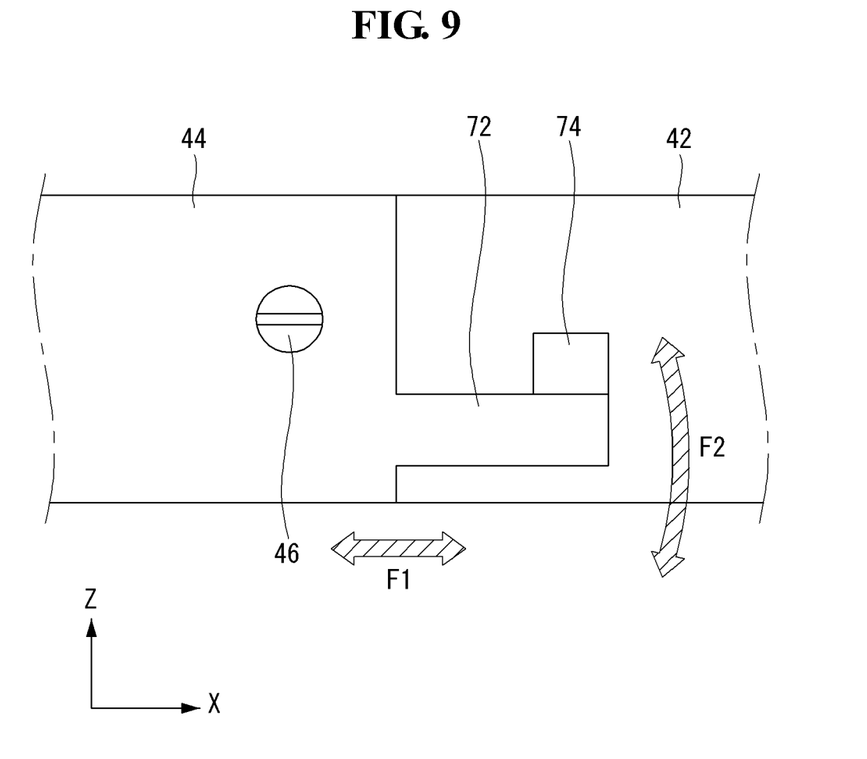
FIGS. 9 and 10 are views illustrating the effects of the first and second frames of FIG. 3.
Figure 10:
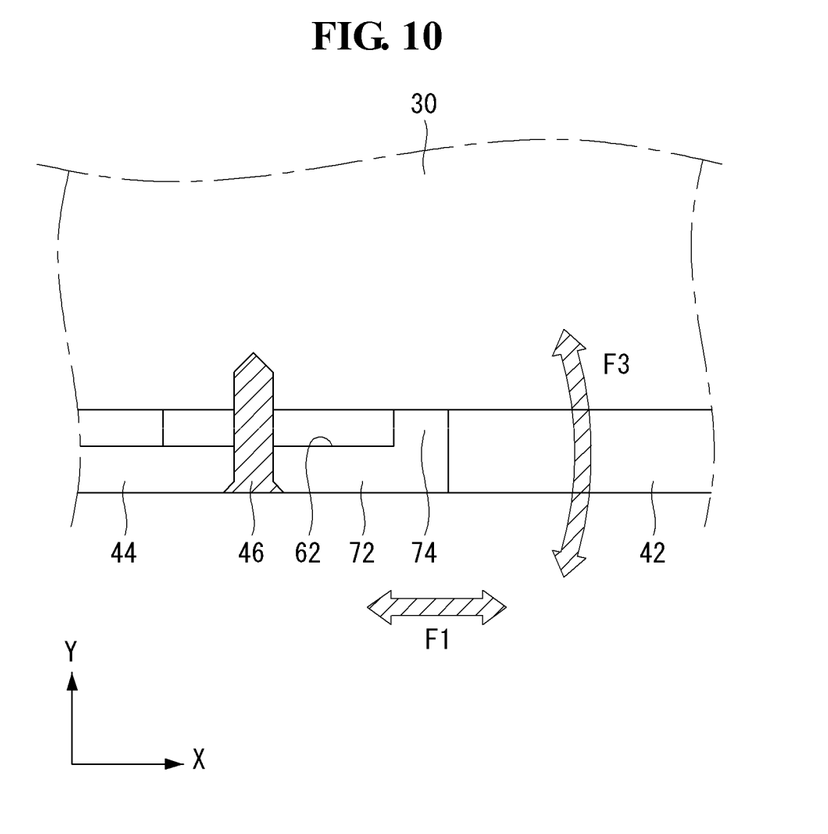

FIGS. 9 and 10 are views illustrating the effects of the first and second frames of FIG. 3. As shown in these drawings, the first and second frames 42 and 44 can be securely connected by the connection structure of the first and second frames 42 and 44 according to one exemplary embodiment of the present disclosure.

A tensile force F1 along the X axis, a first torque F2 along the Z-X axis, and/or a second torque F3 along the Y-X axis may be applied to the connected first and second frames 42 and 44. For example, this means that an external force may be applied in the course of placing an assembled display device 10 on a table or moving the display device 10.

When the tensile force F1 is applied, the first and second frames 42 and 44 may remain fastened by the locking protrusion 74. That is, the tensile force F1 may be offset by the locking protrusion 74 that is bent upward from the locking rib 72 and protrudes by W in the thickness direction of the first frame 72.

When the first and second torques F2 and F3 are applied, the first and second frames 42 and 44 may remain fastened by the locking rib 72 and/or the locking protrusion 74. This means that the first torque F2 may be offset by the locking rib 72 and/or locking protrusion 74 fastened to the connecting surface 62.

Figure 11:
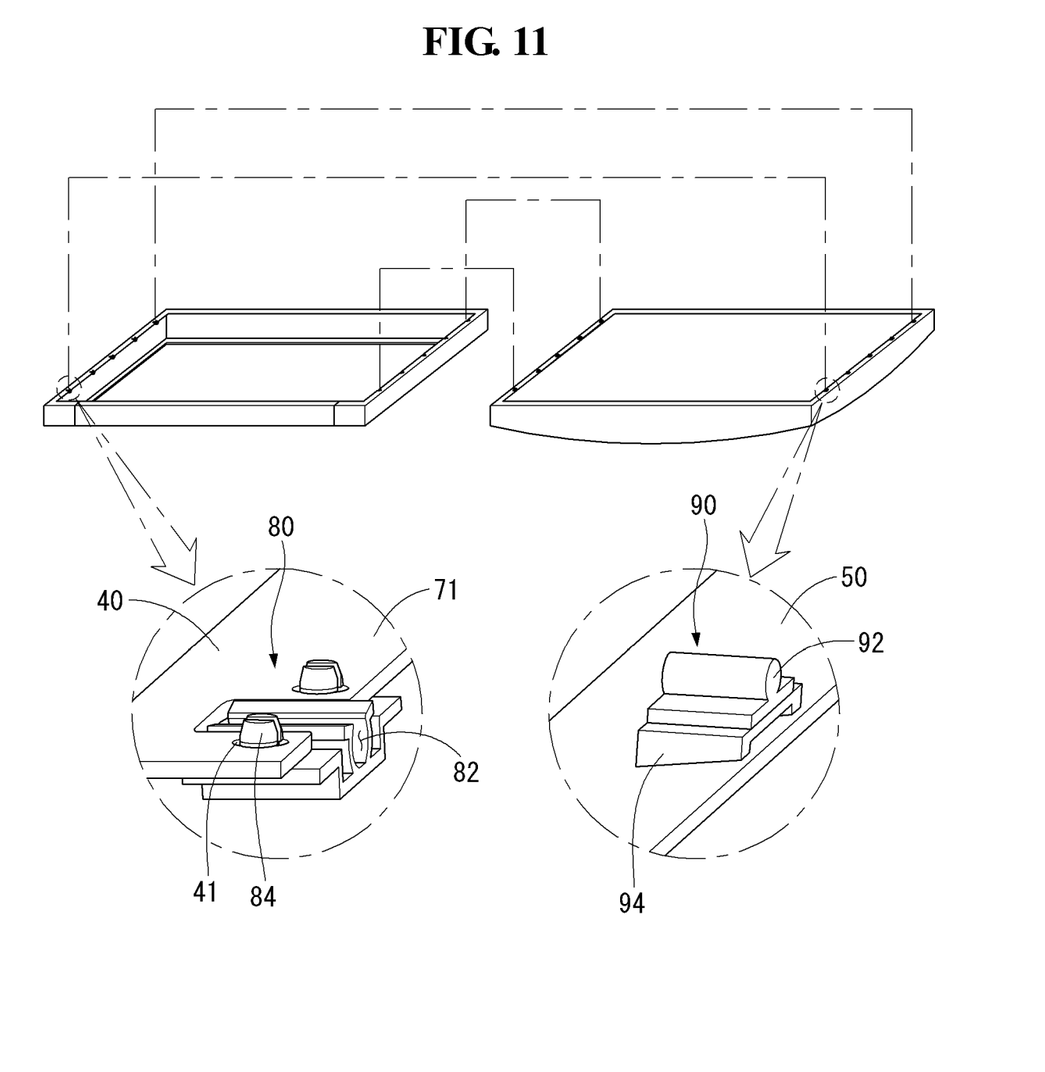
FIG. 11 is a view illustrating the relationship of connection between the frame and back cover of the display device of FIG. 1.

FIG. 11 is a view illustrating the relationship of connection between the frame and back cover of the display device of FIG. 1. As shown therein, the frame 40 and back cover 50 of the display device 10 according to one exemplary embodiment of the present disclosure may be connected via a first holder 80 on the side of the frame 40 and a second holder 90 on the side of the back cover 50. Using the first and second holders 80 and 90 according to one exemplary embodiment of the present disclosure, the frame 40 and the back cover 50 can remain securely fastened and be easily separated and reconnected for repairs, etc.

The first holder 80 may be located on the side of the frame 40. For example, the first holder 80 may be located on the first frame 42 of the frame 40. The first holder 80 may be provided on a portion 71 of the second frame 44 that extends along a rear of the display part 20 to cover a portion of the rear of the display panel 20. The first holder 80 may be connected to a connecting long hole 41 provided in the frame 40.

The connecting long hole 41 may be an oval connecting hole. A head 84 extending from the body of the first holder 80 may pass through and be connected to the connecting long hole 41. As the connecting long hole 41 is shaped like an oval, the head 84 may move back and forth along the connecting long hole 41. When the head 84 moves back and forth, the first holder 80 may likewise move back and forth. Accordingly, the first and second holders 80 and 90 may be easily connected even if their positions do not exactly correspond to each other.

The second holder 90 may be located on the side of the back cover 50. For example, the second holder 90 may be placed on the outer periphery of the back cover 50. The position of the second holder 90 may correspond to the position of the first holder 80 of the frame 40. For example, the second holder 90 may be positioned away from the edge on the surface that covers the rear of the display panel and corresponding to the first holder 80 positioned on the protruding portion 71 of the second frame 44. The second holder 90 may comprise a base end portion 94 extending from the back cover 50 and a circular body 92 connected to the base end portion 94. The base end portion 94 and the circular body 92 may be formed integral with the back cover 50. For example, the base end portion 94 and the circular body 92 may be components which are injection molded, along with the back cover 50.

The circular body 92 may have a shape corresponding to a circular connecting portion 82 of the first holder 80. For example, the circular body 92 may be cylindrical. Since the cylindrical circular body 92 is connected to the corresponding cylindrical circular connecting portion 82, there will be room for the first and second holders 80 and 90 to move in the lengthwise direction of the circular body 92. Accordingly, the first and second holders 80 and 90 may be connected more easily. The circular body 92 and connecting portion 82 may have other shapes such as oval or diamond shaped cross-sections. In certain embodiments, the circular body 92 may have a ball-type shape and the connecting portion 82 may be shaped to secure while allowing small movements.

Figure 12:
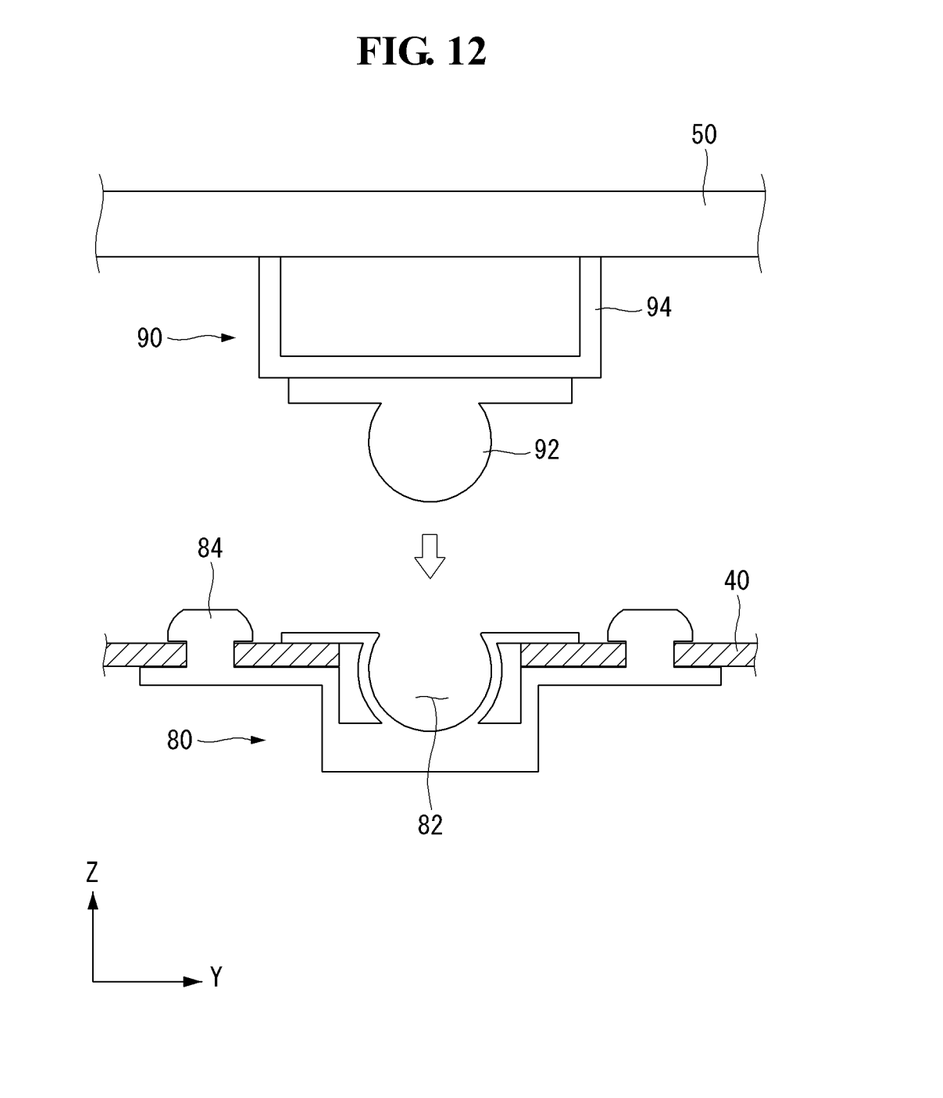
FIGS. 12 and 13 are views illustrating the first holder of the frame of FIG. 11 and the second holder of the back cover of FIG. 11.
Figure 13:
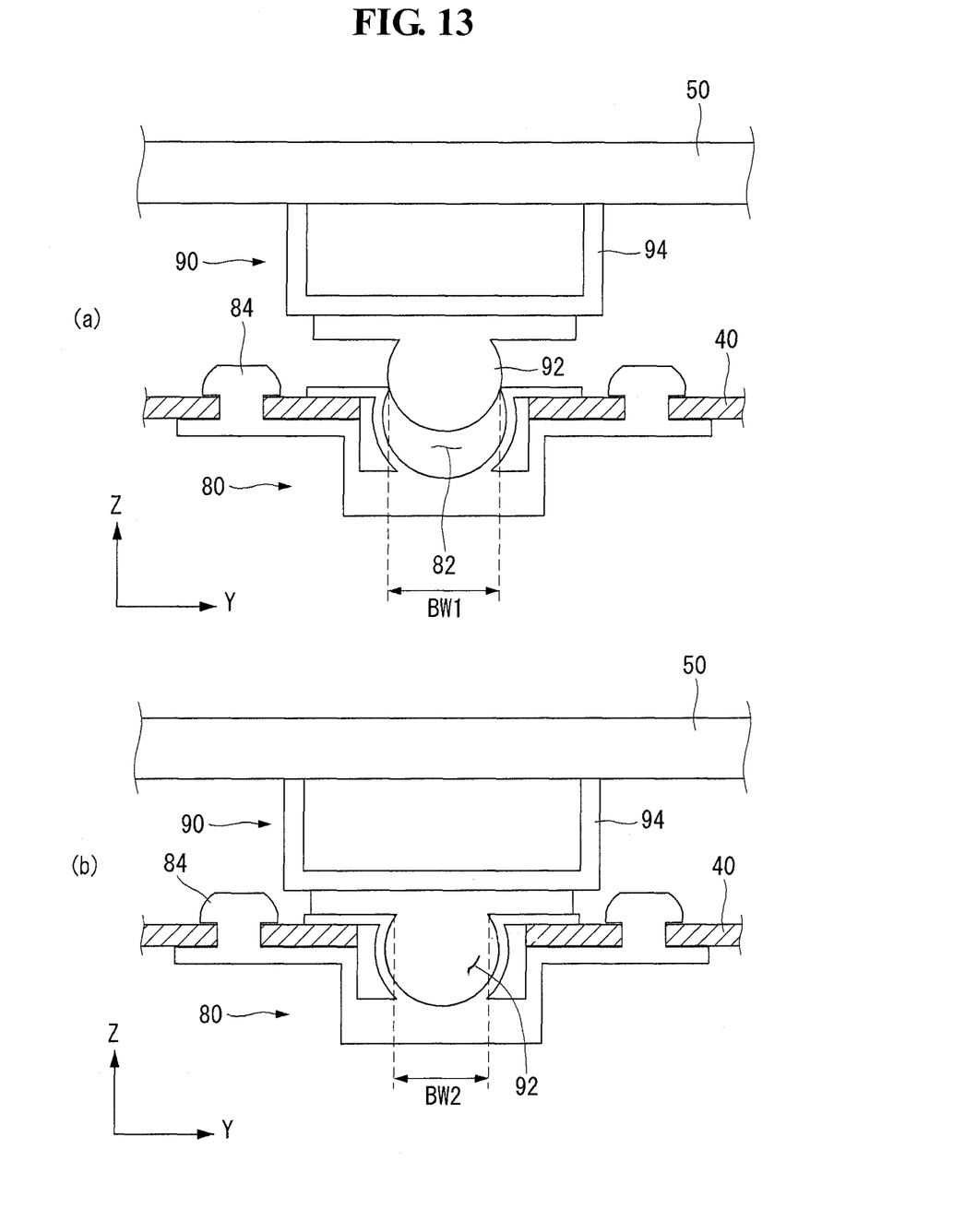

FIGS. 12 and 13 are views illustrating the first holder of the frame of FIG. 11 and the second holder of the back cover of FIG. 11. As shown in these drawings, the first and second holders 80 and 90 according to one exemplary embodiment of the present disclosure may be fastened by connecting the circular body 92 to the circular connecting portion 82.

As shown in FIG. 12, the first holder 80 and the second holder 90 may be connected to or formed in the frame 40 and the back cover 50, respectively. The operator, if they want to connect the back cover 50 to the frame 40, may move the back cover 50 to approach the frame 40. Accordingly, the circular body 92 of the back cover 50 may approach the circular connecting portion 82 of the frame 40.

As shown in (a) of FIG. 13, the circular body 92 may come into contact with the outer edge or opening of the circular connecting portion 82. The maximum diameter of the circular body 92 may be greater than the diameter BW1 of the opening of the circular connecting portion 82.

When the operator presses the back cover 50, the pressing force may be applied to the circular body 92. When the pressure is applied to the circular body 92, the circular connecting portion 82 may be deformed due to the circular body 92 contacting it. That is, the circular connecting portion 82 may be elastically deformed, making the diameter of the entry of the circular connecting portion 82 greater than BW1.

As shown in (b) of FIG. 13, when the circular connecting portion 82 is elastically deformed due to the application of pressure on the back cover 50, the circular body 92 may be inserted into the circular connecting portion 82. When the circular body 92 is inserted into the circular connecting portion 82, the diameter of the entry of the circular connecting portion 82 may return to the original diameter BW2. Once the diameter of the entry of the circular connecting portion 82 returns to the original diameter, the circular body 92 can remain connected to the circular connecting portion 82 unless a considerable amount of external force is applied.

Figure 14:
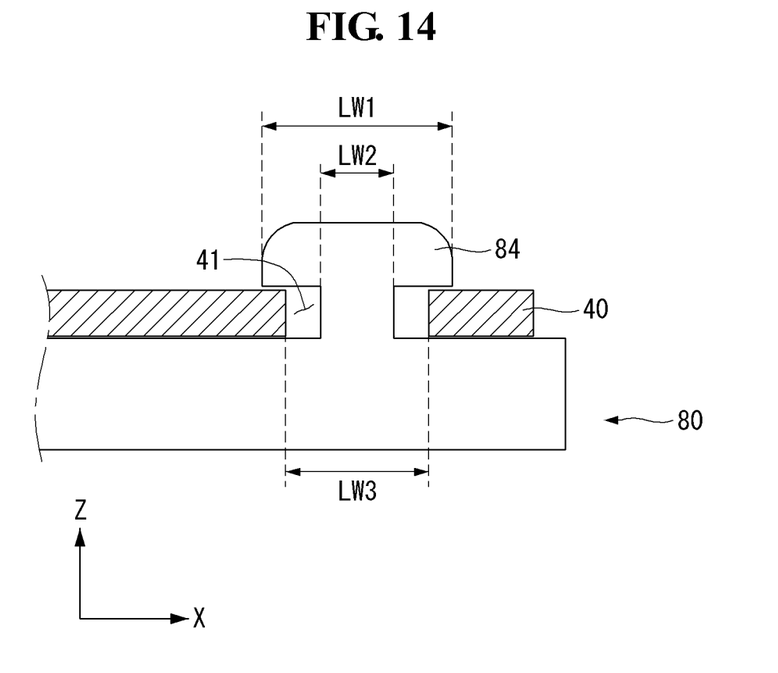
FIGS. 14 and 15 are views showing the operation of the first holder of FIG. 11.
Figure 15:
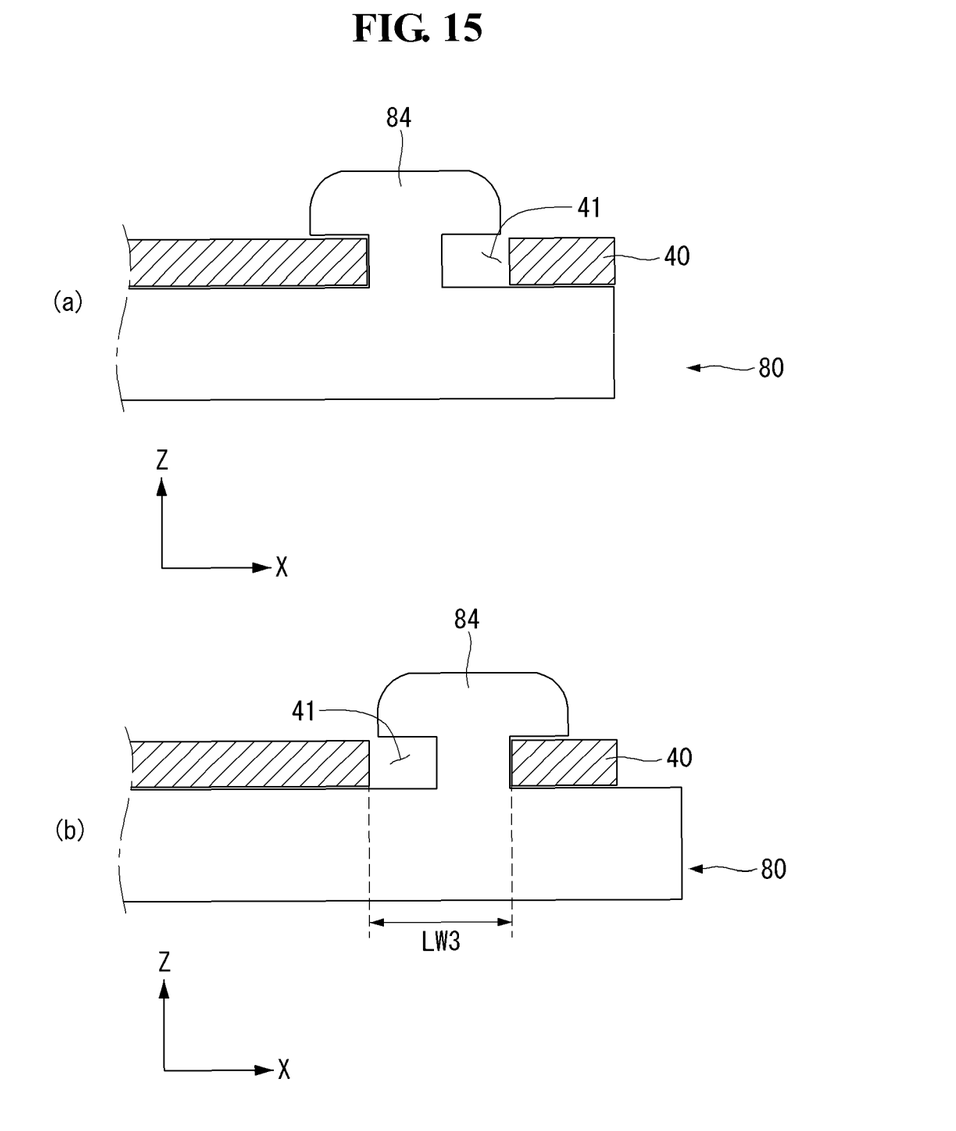

FIGS. 14 and 15 are views showing the operation of the first holder of FIG. 11. As shown in these drawings, the first holder 80 according to one exemplary embodiment of the present disclosure may comprise a neck extending from the body of the first holder 80 and a head 84 formed on the edge of the neck. The width of the neck may be LW2, and the width of the head 84 may be LW1. The width of the connecting long hole 41 may be LW3. LW2 may be less than LW3, and LW1 may be greater than LW3.

As shown in (a) and (b) of FIG. 15, the first holder 80 may be moved backward or forward. This means that the neck is freely movable within the connecting long hole 41 because the length of the connecting long hole 41 is greater than the width of the neck extending from the body of the first holder 80. When the neck moves, this will result in causing the whole first holder 80 to move forward or backward. Accordingly, the first and second holders 80 and 90 may be connected even if they are not precisely positioned.

As broadly described and embodied herein, provided is a display device which allows first and second frames to be securely connected together by surface contact.

An exemplary embodiment of the present disclosure provides a display device comprising: a display panel; and a frame configured to be connected to the display panel and have at least one first frame and a second frame connected to each other, the at least one first frame comprising at last one connecting surface, and the second frame comprising at least one locking rib configured to have a shape corresponding to the at least one connecting surface and come into surface contact with a locking groove.

The connecting surface may be a region where at least a part of the first frame differs in height from at least another part of the first frame in the lengthwise direction of the first frame, and the locking rib may be configured to extend from the second frame in the lengthwise direction of the first frame so as to correspond to the at least a part of the frame.

The first frame may comprise at least one locking grooves configured to penetrate into at least part of the first frame, and the second frame comprises at least one locking protrusion configured to have a shape corresponding to the at least one locking groove and be inserted into the at least one locking groove.

The at least one locking protrusion may be configured to protrude than the at least one locking rib in the thickness direction of the second frame.

The first frame and the second frame may be configured to form a frame by connecting the at least one connecting surface and the at least one locking rib together.

The display device may further comprise: a back cover configured to be connected to the opposite side of the display panel with respect to the first and second frames; at least one first holder configured to be spaced apart from each other by a predetermined distance; and at least one second holder configured to be formed at a position corresponding to the at least one first holder and connected to the at least one first holder.

The display device may comprise: a cylindrical body configured to be formed on either one of the at least one first holder and the at least one second holder; and a cylindrical connecting portion configured to be formed on the other one of the at least one first holder and the at least one second holder to correspond to the cylindrical body, into which the cylindrical body is inserted.

The cylindrical connecting portion may be configured to be connected to a connecting long hole so as to be movable in the lengthwise direction.

A display device according to the present disclosure has the advantage of allowing first and second frames to be securely connected together by surface contact.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a display panel;
   a cover covering a back side of the display panel;
   a frame between the display panel and the cover;
   a first holder positioned on the frame;
   a second holder positioned on the cover corresponding to the first holder and coupled to the first holder,
   wherein the first holder includes a connection portion formed to be elastic and the second holder includes a circular body that can be inserted into the connecting portion, and
   wherein the connecting portion includes an elongated opening,
   wherein the circular body has a length corresponding to the elongated opening and various widths in an inserting direction of the circular body, and
   wherein at least one of the various widths is greater than a width of the elongated opening.

2. The display device of claim 1, wherein the frame has an oval hole near the first holder, and
   wherein the first holder includes a neck extended from the connecting portion and inserted into the oval hole, and a head formed on the neck and positioned to an outside of the oval hole.

3. The display device of claim 2, wherein a width of the neck is smaller than a width of the oval hole, and
   wherein a width of the head is greater than the width of the oval hole.

4. The display device of claim 3, wherein the display device further comprises a plurality of the first holders disposed apart from each other by a prescribed distance and a plurality of the second holders disposed corresponding to the plurality of the first holders.

5. The display device of claim 1, wherein the frame is a side cover that covers a side of the display panel.

6. The display device of claim 1, wherein the frame has a portion which overlaps the back side of the display panel.

7. The display device of claim 6, wherein the first holder is positioned on the portion of the frame.

8. The display device of claim 1, wherein the frame includes a first frame and a second frame,
   wherein the first frame has a connecting surface that is recessed at a distal end of the first frame,
   wherein the second frame has a locking rib that extends from a distal end of the second frame and has a shape that corresponds to a shape of the connecting surface, and
   wherein the locking rib on the second frame makes surface contact with the connecting surface on the first frame.

9. The display device of claim 8, wherein the connecting surface is recessed by a prescribed depth on an outer surface of the first frame, and the locking rib is provided over the recessed connecting surface.

10. The display device of claim 8, wherein
    the first frame includes a locking groove provided at a distal end of the connecting surface,
    wherein the locking groove is recessed further into the first frame than the connecting surface,
    wherein the second frame includes a locking protrusion provided at a distal end of the locking rib, and
    wherein the locking rib has a shape to be inserted into the locking groove.

11. The display device of claim 1, wherein at least one of the various widths is greater than the width of the elongated opening when the circular body is inserted into the opening of the connecting portion.

* * * * *